(12) United States Patent
Johnson et al.

(10) Patent No.: US 7,535,258 B1
(45) Date of Patent: May 19, 2009

(54) PROGRAMMABLE CURRENT OUTPUT AND COMMON-MODE VOLTAGE BUFFER

(75) Inventors: Phillip L. Johnson, Allentown, PA (US); William B. Andrews, Emmaus, PA (US); Gregory S. Cartney, Coplay, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 11/593,274

(22) Filed: Nov. 6, 2006

Related U.S. Application Data

(63) Continuation-in-part of application No. 11/012,548, filed on Dec. 15, 2004, now Pat. No. 7,215,148.

(51) Int. Cl.
*H03K 19/0175* (2006.01)

(52) U.S. Cl. .............................. 326/82; 326/68; 326/83; 326/86; 326/87; 327/109

(58) Field of Classification Search .................. 326/63, 326/68, 82–83, 86–87; 327/108–109
See application file for complete search history.

(56) References Cited

U.S. PATENT DOCUMENTS

| | | | |
|---|---|---|---|
| 5,939,904 A * | 8/1999 | Fetterman et al. ............. | 327/67 |
| 6,111,431 A | 8/2000 | Estrada ......................... | 326/83 |
| 6,236,238 B1 | 5/2001 | Tanji et al. ..................... | 326/83 |
| 6,281,715 B1 | 8/2001 | DeClue et al. ................. | 327/65 |
| 6,356,141 B1 * | 3/2002 | Yamauchi ..................... | 327/543 |
| 6,433,579 B1 | 8/2002 | Wang et al. .................... | 326/38 |
| 6,480,026 B2 | 11/2002 | Andrews et al. .............. | 326/39 |
| 6,590,422 B1 * | 7/2003 | Dillon .......................... | 326/86 |
| 6,617,888 B2 | 9/2003 | Volk ............................. | 327/67 |
| 6,639,434 B1 | 10/2003 | Rahman ....................... | 327/108 |
| 6,731,135 B2 * | 5/2004 | Brunolli ........................ | 326/83 |
| 6,836,149 B2 * | 12/2004 | Chow ........................... | 326/83 |
| 6,900,663 B1 * | 5/2005 | Roper et al. ................... | 326/83 |
| 6,975,135 B1 | 12/2005 | Bui .............................. | 326/29 |
| 6,992,508 B2 | 1/2006 | Chow ........................... | 326/86 |
| 7,012,450 B1 | 3/2006 | Oner et al. ..................... | 326/86 |
| 7,215,148 B1 * | 5/2007 | Johnson et al. ............... | 326/83 |
| 7,382,160 B2 * | 6/2008 | Nagano et al. ................. | 326/86 |
| 2003/0085736 A1 * | 5/2003 | Tinsley et al. ................. | 326/81 |
| 2003/0193350 A1 * | 10/2003 | Chow ........................... | 326/83 |

OTHER PUBLICATIONS

U.S. Appl. No. 11/012,548, filed Dec. 15, 2004.

* cited by examiner

*Primary Examiner*—Vibol Tan
*Assistant Examiner*—Jason Crawford
(74) *Attorney, Agent, or Firm*—Mendelsohn & Associates, P.C.

(57) ABSTRACT

A buffer for a programmable logic device has programmable current sink and source circuitry and an independently programmable common-mode voltage reference source. An amplifier, responsive to a common-mode voltage detector and the voltage reference source, forces a common-mode voltage of an output signal from the buffer to approximate the voltage from the common-mode voltage reference source.

17 Claims, 3 Drawing Sheets

100

200

PROGRAMMABLE CURRENT OUTPUT AND COMMON-MODE VOLTAGE BUFFER

RELATED APPLICATIONS

This application is a continuation-in-part of U.S. patent application Ser. No. 11/012,548, filed 15 Dec. 2004, now U.S. Pat. No. 7,215,148 and assigned to the assignee of this application, and is incorporated herein by reference in its entirety.

TECHNICAL FIELD

The present invention relates to programmable logic devices, such as field-programmable gate arrays (FPGAs), and, in particular, to the input/output (I/O) buffer architecture of such devices.

BACKGROUND

Because they are programmable, FPGAs can be configured (i.e., programmed) to support different signal and data processing applications. In order to support different types of applications, FPGAs can be designed with different types of programmable I/O buffers, each different type of programmable buffer being designed to handle the voltage swings and common-mode voltages associated with different I/O standards.

SUMMARY

In one embodiment, the present invention is a programmable logic device having a buffer, the buffer having at least one controlled current source, at least one input node adapted to receive at least one input signal, and first and second output nodes adapted to present first and second output signals. A detector is adapted to generate a sampled voltage corresponding to a common-mode voltage of the output nodes, and a controlled voltage source is adapted to generate a common-mode reference voltage. An amplifier is adapted to adjust the at least one controlled current source in response to the sampled voltage and the common-mode reference voltage. The controlled voltage source is controlled independently of the at least one controlled current source.

In still another embodiment, the present invention is a method for processing an input signal to present an output signal at two output nodes. One or more controlled currents and a reference voltage are generated. At least one of the one or more controlled currents is selectively applied to the two output nodes based on the input signal. A common-mode output voltage of the output signal is adjusted to approximate the reference voltage. Generation of the reference voltage is independent of the generation the one or more controlled currents.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

For purposes of this description and unless explicitly stated otherwise, each numerical value and range should be interpreted as being approximate as if the word "about" or "approximately" preceded the value of the value or range. Further, reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Also for purposes of this description, the terms "couple," "coupling," "coupled," "connect," "connecting," or "connected," refer to any manner known in the art or later developed in which energy is allowed to be transferred between two or more elements and the interposition of one or more additional elements is contemplated, although not required. Conversely, the terms "directly coupled," "directly connected," etc., imply the absence of such additional elements.

Also, for purposes of this description, it is understood that all gates are powered from a fixed power supply (or supplies) or ground unless shown otherwise. Accordingly, all digital signals generally have voltages that range from approximately ground potential to that of one of the power supplies and transition (slew) quickly.

Signals and nodes or ports may be referred to by the same name and are interchangeable for purposes here.

Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

Figure 1:
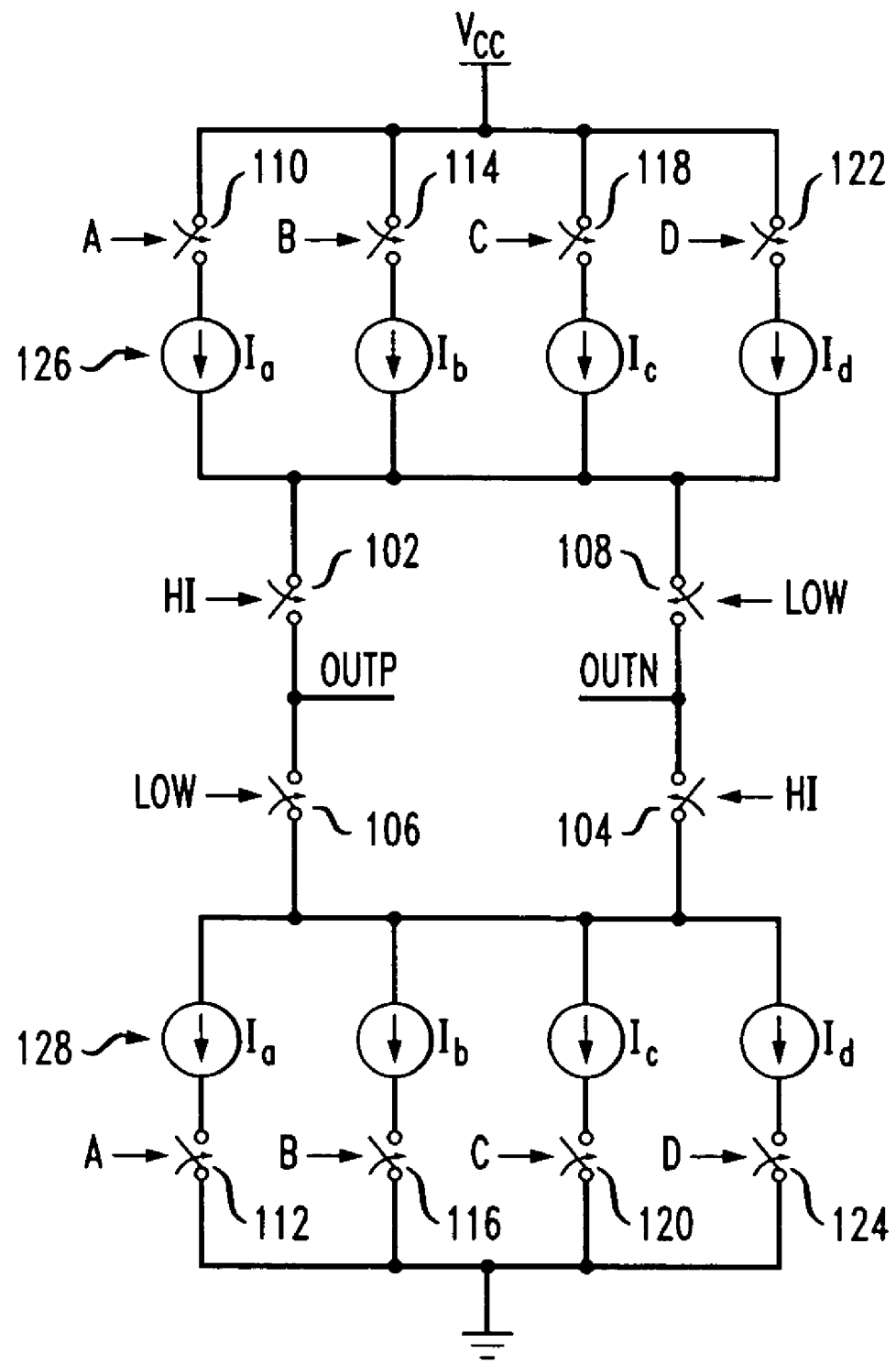
FIG. 1 shows a schematic diagram of a portion of a differential buffer, according to one embodiment of the present invention.

FIG. 1 shows a schematic diagram of a portion of a differential buffer 100, according to one embodiment of the present invention. Differential buffer 100 is typically part of a larger integrated circuit, such as an FPGA, which may have, in addition to other circuitry, multiple instances of differential buffer 100. Differential buffer 100 receives a differential input signal (HI, LOW) and generates a corresponding differential output signal (OUTP, OUTN). Input signal HI is applied to control the state (i.e., open or closed) of input switches 102 and 104, while input signal LOW is applied to control the state of input switches 106 and 108. Under normal operating conditions, the values for input signals HI and LOW are controlled, such that input switches 102 and 104 are open, if input switches 106 and 108 are closed, and vice versa.

In addition, differential buffer 100 receives four control signals A, B, C, and D, where control signal A controls the state of current switches 110 and 112, control signal B controls the state of current switches 114 and 116, control signal C controls the state of current switches 118 and 120, and control signal D controls the state of current switches 122 and 124, where the state of each pair of current switches is independently controllable by its corresponding control signal.

Depending on which pairs of current switches are closed, different total source and sink currents are applied to the input terminals of input switches 102-108. In general, the total source current and the total sink current can be any additive combination of one or more of the currents $I_a$, $I_b$, $I_c$, and $I_d$ generated by current sources 126 and current sinks 128, respectively.

If input switches 102 and 104 are open and input switches 106 and 108 are closed, then the total source current is applied to the output terminal of switch 108 at output node OUTN, and the total sink current is applied to the output terminal of switch 106 at output node OUTP. (Note that, in this specification, the same term (e.g., OUTN) may be used to refer to a node and to the signal that appears at that node.) Similarly, if input switches 102 and 104 are closed and input switches 106 and 108 are open, then the total source current is applied to the output terminal of switch 102 at output node OUTP, and the total sink current is applied to the output terminal of switch 104 at output node OUTN.

Figure 2:
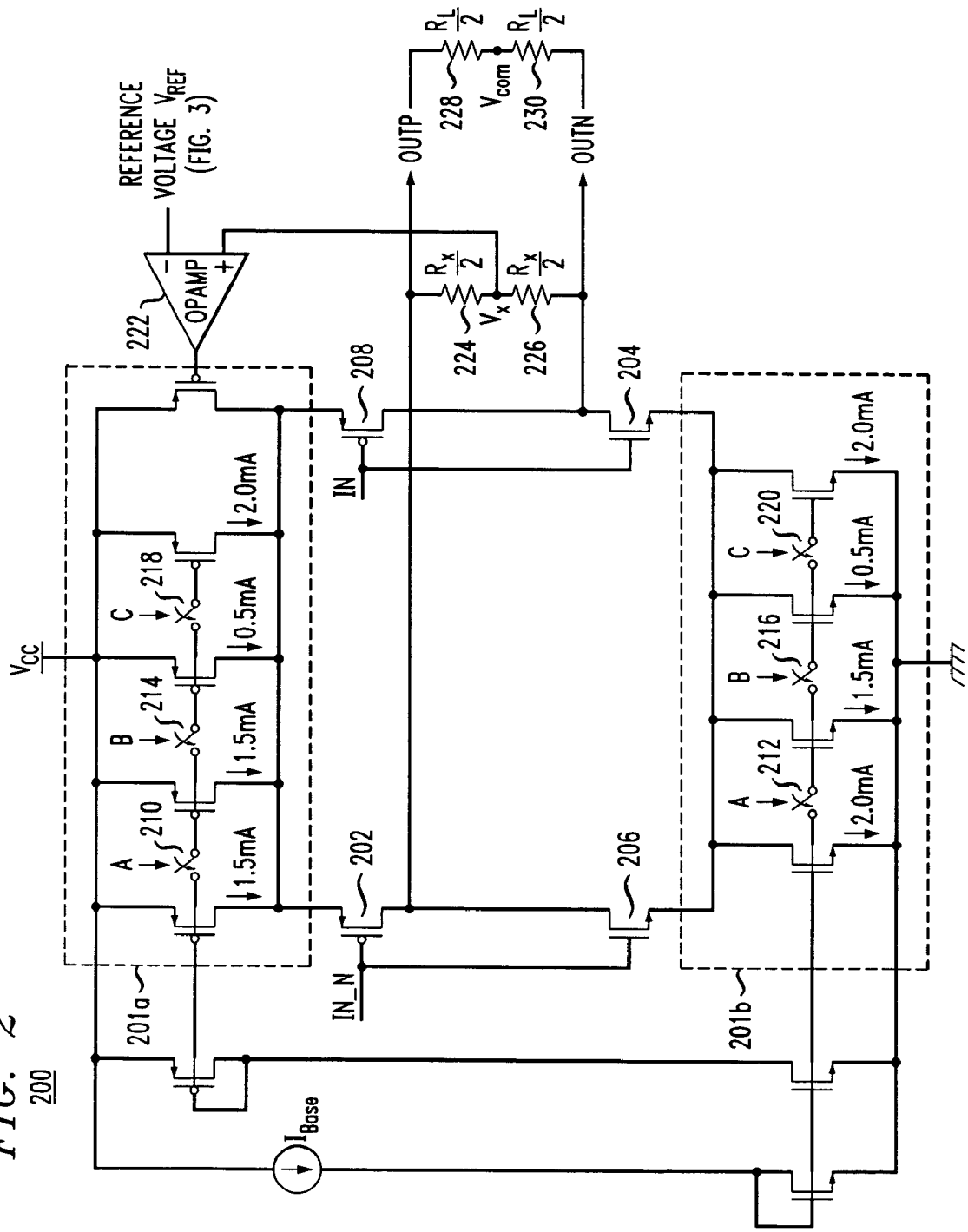
FIG. 2 shows a more detailed and more complete schematic diagram of a differential buffer, according to another embodiment of the present invention; and, FIG. 3 shows a detailed schematic diagram of a programmable voltage source for setting the common-mode voltage of the differential buffer of FIG. 2, according to another embodiment of the invention.

FIG. 2 shows a more detailed and more complete schematic diagram of a differential buffer 200, according to another embodiment of the present invention. Differential buffer 200 receives a differential input signal (IN, IN_N), where IN and IN_N are rail-to-rail complementary input signals, and generates a corresponding output signal (OUTP, OUTN), where OUTP and OUTN are complementary output signals relative to a common-mode voltage $V_{com}$. The input signal IN is applied to control the state of input switch devices 204 and 208, while the input signal IN_N is applied to control the state of input switch devices 202 and 206, where input switch devices 202-208 are functionally equivalent to input switches 102-108 of FIG. 1. As in differential buffer 100 of FIG. 1, under normal operating conditions, if input switch devices 202 and 204 are on (equivalent to switch closed), then input switches 206 and 208 are off (equivalent to switch open), and vice versa.

Programmable current source circuitry 201a supplies current to switches 202-208 and programmable current sink circuitry 201b sinks current from the switches 202-208. The differential buffer 200 receives three control signals A, B, and C, for controlling the programmable circuitry 201a, 201b, where control signal A controls the state of current switches 210 and 212, control signal B controls the state of current switches 214 and 216, and control signal C controls the state of current switches 218 and 220. Note that current switches 210-220 are similar to, but not functionally identical to current switches 110-124 of FIG. 1.

Differential buffer 200 supports a smaller number of different total source and sink currents than does differential buffer 100 of FIG. 1. In particular, if all of switches 210-220 are open, then the total source and sink currents are both 2 mA, where $I_{Base}$ is the basic current for the entire block (e.g., 50 μA). Note that operational amplifier 222 supplies approximately 500 μA so that the total source current (PMOS in this implementation) matches the total sink current (NMOS in this implementation). If switches 210-212 are closed, then the total source and sink currents are both 3.5 mA. Similarly, if switches 210-216 are closed, then the total source and sink currents are both 4 mA, and lastly, if switches 210-220 are all closed, then the total source and sink currents are both 6 mA. Note that, because of the series arrangement of switches 210-220, if switches 210-212 are open, then the states of switches 214-220 are irrelevant (i.e., do not affect the total source and sink currents). Similarly, if switches 214-216 are open, then the states of switches 218-220 are irrelevant. It is understood, however, that the switches 210-220 can be disposed in a parallel arrangement, so that the state of all the switches 210-220 are always relevant, or a combination of series and parallel arrangements.

If input switch devices 202 and 204 are off and input switch devices 206 and 208 are on, then the total source current is applied to the output terminal of switch device 208 at output node OUTN, and the total sink current is applied to the output terminal of switch 206 at output node OUTP. Similarly, if input switch devices 202 and 204 are on and input switch devices 206 and 208 are off, then the total source current is applied to the output terminal of switch device 202 at output node OUTP, and the total sink current is applied to the output terminal of switch device 204 at output node OUTN.

As shown in FIG. 2, resistors 224-230 convert the source and sink currents applied to output nodes OUTP and OUTN into a differential output voltage signal (OUTP, OUTN). In order to minimize current loss within differential buffer 200, resistors 224 and 226 preferably have a much greater resistance value than resistors 228 and 230 (i.e., $R_X >> R_L$), which results in the current passing through reference resistors 224 and 226 being much less than the current passing through load resistors 228 and 230. Operational amplifier (OPAMP) 222 forces the common-mode voltage $V_{com}$ to a desired level (e.g., based on input common-mode reference voltage $V_{REF}$), where the common-mode voltage $V_{com}$ and the sampled common-mode voltage $V_X$ are approximately the same (e.g., within circuit tolerances).

Figure 3:
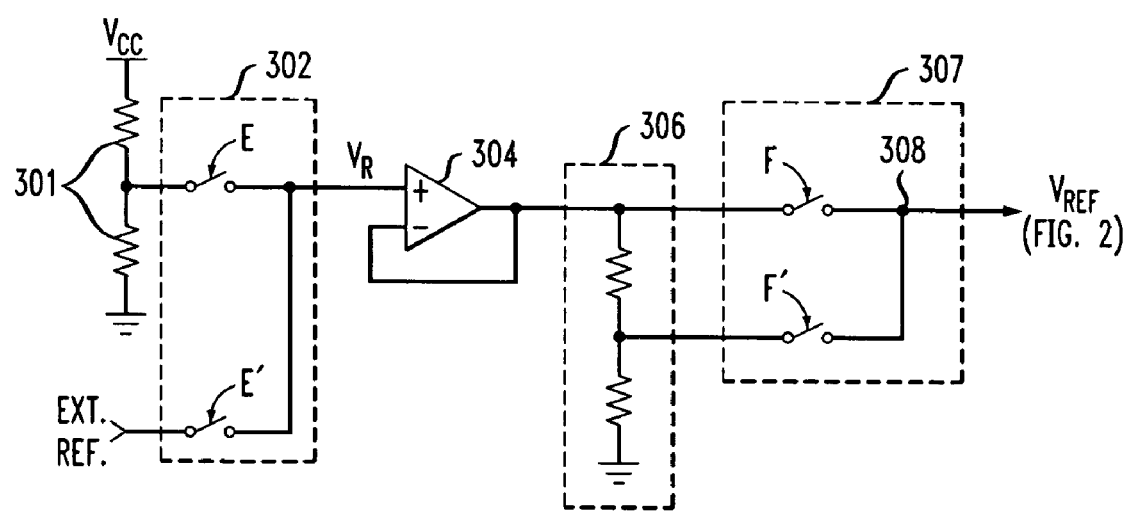

Exemplary circuitry 300, a programmably controlled voltage source, for generating $V_{REF}$ is shown in FIG. 3. In this embodiment, a reference voltage $V_R$ is derived from either 1) the power source $V_{CC}$ by a resistive voltage divider 301 or 2) from an external source (EXT. REF.). Selection of which source for the reference voltage $V_R$ is made by a set of switches 302 controlled by complementary control signals E, E'. While only two sources of $V_R$ is shown, it is understood by those skilled in the art that more than two sources for the reference voltage $V_R$ may be used, such as from a band-gap voltage reference, along with a corresponding increase in the number of switches in switch set 302 and corresponding control signals. The reference voltage $V_R$ is buffered by an operational amplifier 304 wired as a voltage follower. The buffered reference voltage drives a second resistive voltage divider 306 that provides a plurality of output voltages including, in this example, the buffered reference voltage. A set of switches 307, under control of complementary control signals F and F', select one of the plurality of voltages from divider 306 to node 308 to form the common-mode reference voltage $V_{REF}$. In this example, the voltage divider 301 provides a reference voltage $V_R$ of about 1.2 volts and the common-mode voltage reference $V_{REF}$ has a voltage of either about 1.2 volts or 0.6 volts.

While the voltage divider 306 is shown with only two outputs going to switch set 307, it is understood by those skilled in the art that more than two output voltages can be provided by voltage divider 306, along with a corresponding increase in the number of switches in switch set 307 and control signals. Similarly, more than two sources for the reference voltage $V_R$ may be used, along with a corresponding increase in the number of switches in switch set 302 and control signals. It is further understood that, while control signals E, F are shown with the complements thereof to control the switch sets 302 and 307, non-complementary signals may be used instead or in combination.

Returning to FIG. 2, differential buffer 200 can be configured to support (at least) the following different signaling applications:

Low-Voltage Differential Signaling (LVDS), which operates at a 3.5 mA current level and a 1.2V common-mode;

Reduced-Signal Differential Swing (RSDS), which operates at a 2 mA current level and a 1.2V common-mode;

Hyper Transport, which operates at a 6 mA current level and a 0.6V common-mode; and Mini-LVDS, which operates from 2 to 6 mA current level and a 1.2V common-mode.

In general, differential buffer 200 can support all four different current levels at either 1.2V or 0.6V common-mode by controlling the states of switches 210-220 and the level of reference voltage $V_{REF}$ by configuring switch sets 302, 307 (FIG. 3).

In certain implementations, such as FPGAs, the control signals (e.g., signals A-D in FIG. 1, signals A-C in FIG. 2, and signals E-F in FIG. 3) can be programmably selected by the user after the device is enabled. This enables the user to interactively change the output current levels, and thus the output voltage swing, to selectively conform to a different signaling application. It is noted that the control signals E-F in FIG. 3 are independent of the signals A-D (FIG. 1) and A-C (FIG. 2).

In general, the invention can be implemented in the context of differential buffers that receive either differential or non-differential input signals and generate either differential or non-differential output signals, in any combination, with any plurality, including bipolar.

Although the present invention has been described in the context of a differential amplifier in which an OPAMP "assists" the current sources, the invention could also be implemented in the context of differential amplifiers in which an OPAMP assists the current sinks.

As used in this specification, the term "channel node" refers generically to either the source or drain of a metal-oxide semiconductor (MOS) transistor device. Similarly, as used in the claims, the terms "source," "drain," and "gate" should be understood to refer either to the source, drain, and gate of an MOS device or to the collector, emitter, and base of a bi-polar device when the present invention is implemented using bi-polar transistor technology.

Although the present invention has been described in the context of FPGAs, those skilled in the art will understand that the present invention can be implemented in the context of other types of programmable devices, such as, without limitation, programmable logic devices (PLDs), mask-programmable gate arrays (MPGAs), simple programmable logic device (SPLDs), and complex programmable logic devices (CPLDs). More generally, the present invention can be implemented in the context of any kind of electronic device having programmable elements.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

We claim:

1. A programmable logic device having a buffer, the buffer comprising:

at least one controlled current source;

at least one input node adapted to receive at least one input signal;

first and second output nodes adapted to present first and second output signals;

a detector adapted to generate a sampled voltage corresponding to a common-mode voltage of the output nodes;

a controlled voltage source adapted to generate a common-mode reference voltage; and, an amplifier adapted to adjust the at least one controlled current source in response to the sampled voltage and the common-mode reference voltage, wherein:

the controlled voltage source is controlled independently of the at least one controlled current source; and the at least one controlled current source and the controlled voltage source are adapted to be programmably controlled and are each independently programmable; and wherein the programmably controlled voltage source comprises:

a reference voltage source adapted to produce a reference voltage;

a voltage divider, coupled to the reference voltage source, adapted to produce a plurality of output voltages; and a plurality of switches adapted to selectively couple one of the plurality of voltages from the voltage divider to an output node, wherein a signal on the output node is the common-mode reference voltage.

2. The programmable logic device of claim 1, wherein:

the amplifier adjusts the at least one controlled current source so that the common-mode voltage is approximately equal to the common-mode reference voltage; and the programmable logic device is implemented as a single integrated circuit.

3. The programmable logic device of claim 1, wherein the at least one programmably controlled current source comprises:

source current circuitry adapted to be programmably controlled to selectively generate any one of a plurality of different total source currents;

sink current circuitry adapted to be programmably controlled to selectively generate any one of a plurality of different total sink currents; and, first switch circuitry adapted to selectively apply at least one of a total source current and a total sink current to the first or second output nodes based on the at least one input signal.

4. The programmable logic device of claim 3, wherein the programmably controlled voltage source comprises second switch circuitry adapted to selectively supply one of a plurality of voltages as the common-mode reference voltage.

5. The programmable logic device of claim 3, wherein:

the source current circuitry comprises N switched current sources connected in parallel; and, the sink current circuitry comprises M switched current sinks connected in parallel.

6. The programmable logic device of claim 5, wherein:
the programmably controlled voltage source comprises a plurality of switches;
the N switched current sources are independently programmable;
the M switched current sources are independently programmable; and,
the plurality of switches of the programmably controlled voltage source are independently programmable.

7. The programmable logic device of claim 1, wherein the programmably controlled voltage source further comprises a voltage-follower adapted to couple the reference voltage to the voltage divider.

8. The programmable logic device of claim 1, wherein the reference voltage source is adapted to derive the reference voltage from a power source of the programmable logic device.

9. The programmable logic device of claim 1 wherein the reference voltage source is adapted to derive the reference voltage from a source external to the programmable logic device.

10. The programmable logic device of claim 1, wherein the reference voltage source comprises switches adapted to selectively couple to a node as the reference voltage either 1) a voltage derived from a power source of the programmable logic device or 2) a source external to the programmable logic device.

11. The programmable logic device of claim 1, wherein one of the plurality of output voltages of the voltage divider is approximately equal to the reference voltage.

12. A programmable logic device having a buffer, the buffer comprising:
at least one controlled current source;
at least one input node adapted to receive at least one input signal;
first and second output nodes adapted to present first and second output signals;
a detector adapted to generate a sampled voltage corresponding to a common-mode voltage of the output nodes;
a controlled voltage source adapted to generate a common-mode reference voltage; and
an amplifier adapted to adjust the at least one controlled current source in response to the sampled voltage and the common-mode reference voltage,
wherein:
the controlled voltage source is controlled independently of the at least one controlled current source; and
the at least one controlled current source and the controlled voltage source are adapted to be programmably controlled and are each independently programmable,
wherein the at least one programmably controlled current source comprises a first plurality of programmably controlled current sources connected in parallel and programmably controllable such that at least two of the parallel current sources are selected at the same time.

13. A programmable logic device having a buffer, the buffer comprising:
at least one controlled current source;
at least one input node adapted to receive at least one input signal;
first and second output nodes adapted to present first and second output signals;
a detector adapted to generate a sampled voltage corresponding to a common-mode voltage of the output nodes;
a controlled voltage source adapted to generate a common-mode reference voltage; and,
an amplifier adapted to adjust the at least one controlled current source in response to the sampled voltage and the common-mode reference voltage,
wherein:
the controlled voltage source is controlled independently of the at least one controlled current source; and
the at least one controlled current source and the controlled voltage source are adapted to be programmably controlled and are each independently programmable,
wherein:
the at least one programmably controlled current source comprises at least first, second, and third programmably controlled current sources, each having a gate, connected in parallel;
a first switch connected between the gates of the first and second parallel current sources; and
a second switch connected between the gates of the second and third parallel current sources.

14. A programmable logic device having a buffer, the buffer comprising:
at least one controlled current source;
at least one input node adapted to receive at least one input signal;
first and second output nodes adapted to present first and second output signals;
a detector adapted to generate a sampled voltage corresponding to a common-mode voltage of the output nodes;
a controlled voltage source adapted to generate a common-mode reference voltage; and,
an amplifier adapted to adjust the at least one controlled current source in response to the sampled voltage and the common-mode reference voltage,
wherein:
the controlled voltage source is controlled independently of the at least one controlled current source; and
the at least one controlled current source and the controlled voltage source are adapted to be programmably controlled and are each independently programmable,
wherein the output of the amplifier is connected to the gate of an additional current source connected in parallel to the at least one programmably controlled current source.

15. A programmable logic device having a buffer, the buffer comprising:
at least one controlled current source;
at least one input node adapted to receive at least one input signal;
first and second output nodes adapted to present first and second output signals;
a detector adapted to generate a sampled voltage corresponding to a common-mode voltage of the output nodes;
a controlled voltage source adapted to generate a common-mode reference voltage; and,
an amplifier adapted to adjust the at least one controlled current source in response to the sampled voltage and the common-mode reference voltage,
wherein:

the controlled voltage source is controlled independently of the at least one controlled current source; and the at least one controlled current source and the controlled voltage source are adapted to be programmably controlled and are each independently programmable, wherein the buffer further comprises:

first and second input nodes adapted to receive first and second input signals;

a first pair of transistors connected in series at the first output node; and a second pair of transistors connected in series at the second output node, wherein:

the first input node is connected to apply the first input signal to the gates of the first pair of series-connected transistors; and the second input node is connected to apply the second input signal to the gates of the second pair of series-connected transistors.

16. The programmable logic device of claim 15, wherein:

the first pair of series-connected transistors comprises a n-type transistor and a p-type transistor; and the second pair of series-connected transistors comprises a n-type transistor and a p-type transistor.

17. A programmable logic device having a buffer, the buffer comprising:

at least one controlled current source;

at least one input node adapted to receive at least one input signal;

first and second output nodes adapted to present first and second output signals;

a detector adapted to generate a sampled voltage corresponding to a common-mode voltage of the output nodes;

a controlled voltage source adapted to generate a common-mode reference voltage; and, an amplifier adapted to adjust the at least one controlled current source in response to the sampled voltage and the common-mode reference voltage, wherein:

the controlled voltage source is controlled independently of the at least one controlled current source; and the at least one controlled current source and the controlled voltage source are adapted to be programmably controlled and are each independently programmable, wherein the programmable controlled voltage source comprises a voltage divider coupled to a reference voltage source and adapted to produce a plurality of output voltages, wherein the voltage divider supplies the plurality of different voltages to the output node.

* * * * *